United States Patent [19]

Forster et al.

[11] Patent Number: 4,758,812

[45] Date of Patent: Jul. 19, 1988

[54] FRAME STRUCTURE FOR A MAGNET SYSTEM FOR NUCLEAR SPIN TOMOGRAPHY

[75] Inventors: Helmut Forster, Neunkirchen a. Brand; Horst Siebold, Erlangen, both of Fed. Rep. of Germany

[73] Assignee: Siemens Aktiengesellschaft, Berlin and Munich, Fed. Rep. of Germany

[21] Appl. No.: 32,763

[22] Filed: Mar. 31, 1987

[30] Foreign Application Priority Data

Apr. 21, 1986 [DE] Fed. Rep. of Germany ....... 3613405

[51] Int. Cl.⁴ ................................. H01F 7/00
[52] U.S. Cl. ..................... 335/301; 335/299; 324/320
[58] Field of Search ............... 324/318, 319, 320, 321; 335/299, 301

[56] References Cited

U.S. PATENT DOCUMENTS

| | | | |
|---|---|---|---|
| 4,560,933 | 7/1983 | Forster et al. | 324/319 |
| 4,587,490 | 5/1986 | Muller et al. | 335/301 X |
| 4,590,452 | 8/1984 | Ries et al. | 335/301 |
| 4,612,505 | 9/1986 | Zijlstra | 335/301 X |
| 4,646,045 | 2/1987 | Chari et al. | 335/301 |
| 4,646,046 | 2/1987 | Vakrek et al. | 335/301 |

FOREIGN PATENT DOCUMENTS

| | | | |
|---|---|---|---|
| 0067933 | 12/1982 | European Pat. Off. | 335/301 |
| 0102486 | 3/1984 | European Pat. Off. | 335/299 |
| 0117808 | 9/1984 | European Pat. Off. | 335/299 |
| 0141149 | 5/1985 | European Pat. Off. | 335/301 |
| 0139308 | 6/1985 | European Pat. Off. | 335/299 |
| 0111219 | 7/1985 | European Pat. Off. | 335/301 |

*Primary Examiner*—George Harris
*Attorney, Agent, or Firm*—Kenyon & Kenyon

[57] ABSTRACT

A frame structure for supporting individual magnetic coils forming a magnet system used in nuclear spin tomography comprises several frame parts made from a ferromagnetic material to provide relatively simple magnetic shielding. The individual magnetic coils are concentrically aligned one behind the other along a common axis to form the magnet system. Several elongate beam, rod, or plate-shaped magnetic shielding elements extend parallel to the common axis and are evenly distributed in the circumferential direction around the magnet system thus forming a generally cylindrical surface. End-plate magnetic shielding parts having a central opening of predetermined radius are provided at the end faces of the cylindrical surface formed by the shielding elements to create a cage-like frame structure. Coil receiving elements can be used to rigidly connect the axis-parallel shielding elements with the individual magnetic coils.

7 Claims, 3 Drawing Sheets

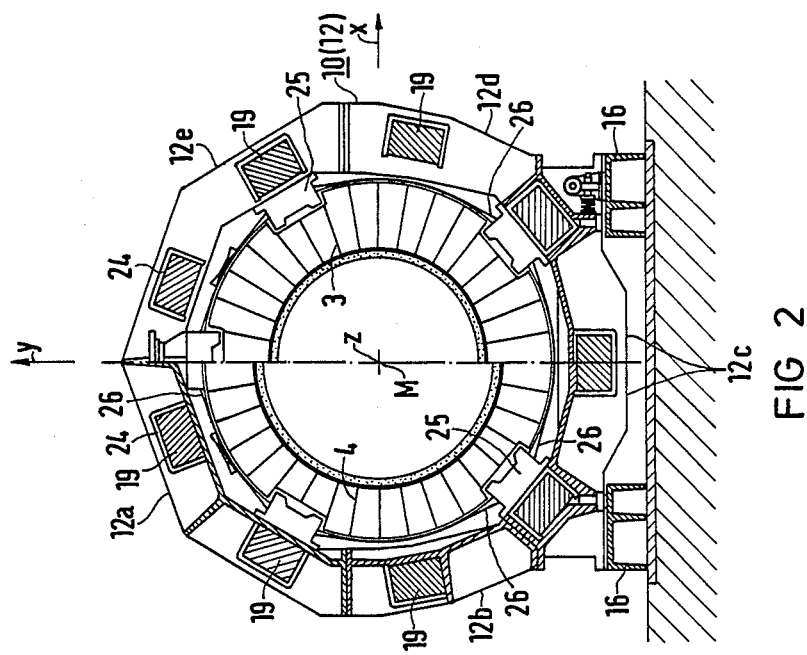
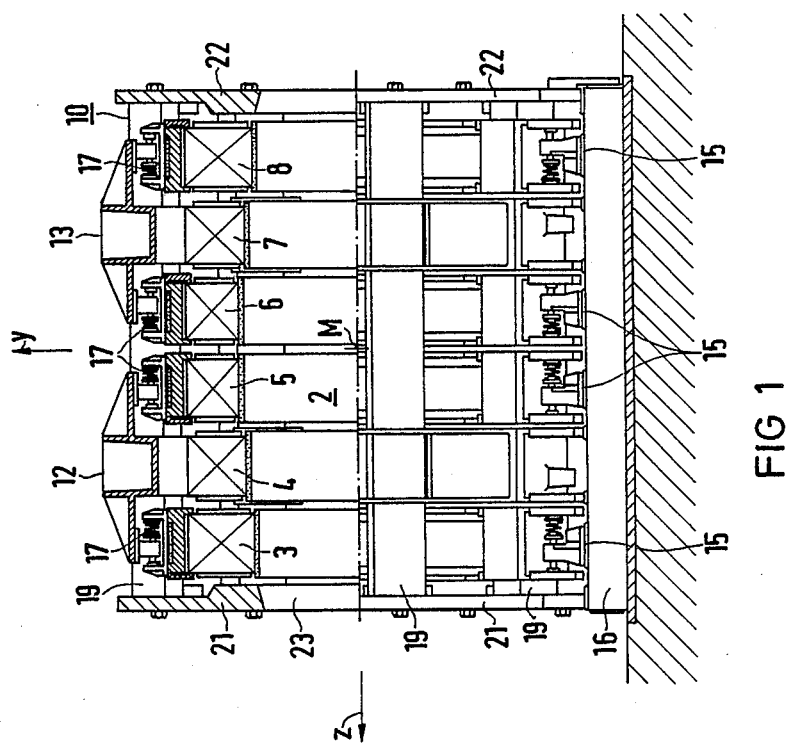

FRAME STRUCTURE FOR A MAGNET SYSTEM FOR NUCLEAR SPIN TOMOGRAPHY

BACKGROUND OF THE INVENTION

The present invention relates to the field of magnetic shielding, and more particularly, to a device for providing magnetic shielding for a magnet system used in nuclear spin tomography.

Picture-producing methods have been developed in the field of medical diagnostics wherein by calculation or measurement, integral resonance signals of the nuclei of a given body element to be examined (particularly that of a human body) are analyzed. From the spatial spin density and/or the relaxation time distribution obtained in this manner, an image similar to that of X-ray tomography may then be constructed. Various techniques of this manner are well known under the designation "Nuclear Spin Tomography" (nuclear magnetic resonance tomography) or "Zeugmatography".

Nuclear spin tomography requires a strong magnetic field. The magnetic field is typically generated by a so-called base field magnet which should be as homogeneous as possible in an imaging or examination range of a predetermined extent. The body to be examined is placed within the imaging or examination range along an axis generally coinciding with the axis of orientation of the magnetic base field. This base field is superimposed by stationary and/or pulsed gradient fields. Further, a separate antenna structure is required in order that a high-frequency alternating magnetic field can be excited for a short time. The antenna structure excites the individual atomic nuclei of the examined body into a precession motion. Frequently, the RF signals produced in this manner are received by the picture-producing means unless special measuring loops are provided to filter the signals.

The base field magnet may be designed as a system of, for example, six individual ring-shaped magnetic coils which are lined up one behind the other along a common axis in the direction of the desired field orientation of the magnetic base field. A frame structure, such as the one disclosed in European Patent No. 0 102 486 A1 comprising several frame parts which extend parallel to the common axis is used for mounting and/or spatially adjusting the individual magnetic coils. In order for the desired high homogeneity of the magnetic field to be achieved, fine geometric adjustments must be made to at least one of the individual coils. European Patent No. 0 102 486 A1, mentioned above, discloses adjusting and holding means which are particularly well suited for this purpose.

The prior art structure comprises a stationary frame made of a magnetically non-conductive material having two lower support rails for supporting the weight of the magnetic coils and an upper support rail for holding the magnetic coils. The frame parts extending parallel to the common axis are mechanically connected to each other through one or more of the individual magnetic coils to form a rigid structure. Special adjusting devices for the magnetic coils not firmly secured are located on the frame structure and allow the individual coils to be easily tipped from their perpendicular position relative to the orientation axis of the magnetic base field.

It is frequently desired in magnet systems of this type to provide a magnetic shield or a magnetic return. European Patent No. 0 067 933 B1 discloses a hollow, ferromagnetic return body enclosing an individual nuclear spin tomography coil. An advantageous modification of the hollow-cylindrical return body noted above is disclosed in European Patent No. 0 141 149 A1 wherein the return body is hexagonically formed of individual beam-like shielding elements. However, a problem with the prior art is that when such magnetic shielding is attempted to be used for an entire magnet system, the amount of shielding material necessary and the space requirements to implement the shielding are prohibitively large. Furthermore, access to the individual magnetic coils for effecting fine adjustments within the frame structure would be obstructed due to the magnetic shielding.

SUMMARY OF THE INVENTION

The problems associated with providing magnetic shielding for a magnet system used in nuclear spin tomography are solved by the present invention by designing the known frame structure in such a way that a relatively simple magnetic shielding effect is possible without the appearance of the aforementioned difficulties.

According to the invention, these problems are solved by integrating into the frame structure elongate beam, rod, or plate-shaped magnetic shielding elements in connection with end-plate magnetic shielding parts. The beam, rod or plate-shaped elements represent the frame parts of the structure extending parallel to the common axis of the magnetic coils. In this manner a compact highly stable frame structure is assured wherein the frame structure performs the function of the magnetic shielding. Also the magnetic shielding frame structure allows easy access to the individual coils for fine adjustment.

Further embodiments of the frame structure according to this invention can be gathered from the detailed description of the invention.

BRIEF DESCRIPTION OF THE DRAWINGS

FIG. 1 is both a longitudinal sectional view through the yz-plane above the xz-plane and an elevational side view below the xz-plane of an embodiment of the frame structure of the present invention.

FIG. 2 is a cross sectional view of the embodiment of FIG. 1 taken partly to the left of the yz-plane through magnet 4 and to the right of the yz-plane through magnet 3.

DETAILED DESCRIPTION

Figure 4:
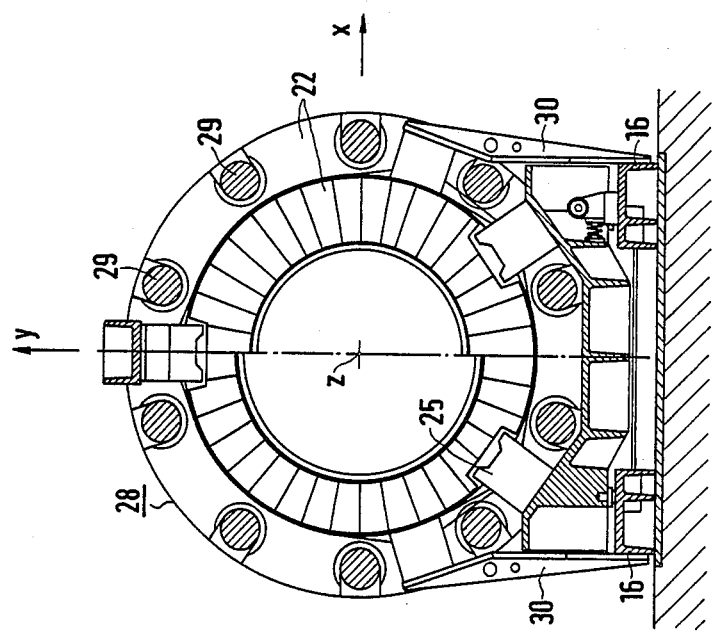
FIG. 4 shows the embodiment of FIG. 3 taken along the same lines as FIG. 2.

Referring to FIG. 1, a first embodiment of a magnet system and frame structure used in nuclear spin resonance technology is shown. The magnet system designated generally at 2 is formed by several individual normal or superconducting coils 3–8 arranged concentrically with respect to the horizontal z-axis of an orthogonal xyz coordinate system. These coils provide a sufficiently homogeneous magnetic base field in a central imaging range, at the center of which M is located the origin of the xyz coordinate system. The magnet system 2 being cylindrical in shape allows for axial access to the homogeneous central imaging range through the end faces thereof. For example, a human body which is to be examined can be placed in the central field region along the z-axis.

The individual annular magnetic coils 3–8 of the magnet system 2 are concentrically lined up one behind the other along the z-axis and are held within a frame structure 10. Two of the magnetic coils, preferably the coils 4 and 7, located adjacent to magnetic coils 3 and 8, respectively, which are next to the end faces, are rigidly connected to the frame structure 10. The rigid connection is made by ring-shaped coil-receiving elements 12 and 13 made from a non-ferromagnetic material, for example, from a casting of an aluminum alloy. These ring-shaped elements lie in a plane perpendicular to the z-axis, i.e., in a radial plane. The remaining magnetic coils 3, 5, 6 and 8 are braced against at least one bottom part 16 through separate support devices 15 within the frame structure 10. In addition, these magnetic coils may be mutually aligned by means of special mechanical positioning devices 17 which are also attached to the frame structure 10. Examples of such support devices 15 and positioning device 17 can be seen from the above mentioned European Patent No. 0 102 486 A1.

The parts of the frame structure 10 extending parallel to the common z-axis are formed by several elongate beam, rod, or plate-shaped shielding elements 19 made from a ferromagnetic material. The arrangement of these elements 19 is shown in detail in FIGS. 2, 4 and 5. As is further shown from FIG. 1, end-plate shielding parts 21 and 22 made from a ferromagnetic material are attached to the end faces of the frame structure 10. Each end plate shielding part has a central opening 23 of a predetermined size. These shielding parts, also designated as pole irons, are required to enable sufficient shielding action. The end plates are rigidly connected to the elongate magnetic shielding elements 19, for example, by a screw connection. In this manner, a frame structure of sufficiently high mechanical stability consisting of the parts 12, 13, 19, 21 and 22 is assured.

The design of the frame structure 10 is shown more clearly from the cross sectional views of FIG. 2, taken partly in a plane through the magnetic coil 4 (left half of FIG. 2) and partly in a plane through the magnetic coil 3 (right half of FIG. 2). The ring-like coil receiving elements 12 and 13, of the frame structure 10 are identically designed. However, only element 12 is visible from FIG. 2. The ring-like coil receiving elements 12 and 13 may be composed of several segment-like individual pieces 12a to 12e made from a nonmagnetic material as shown in FIG. 2. These individual pieces may be bolted together to form the ring-like coil receiving elements 12, 13. In addition, the segment-like pieces 12a to 12e have several axial openings or feedthroughs 24 all of which have the same dimensions into which the elongate beam or rod-like magnetic shielding elements 19 may be inserted. A preferred location for the openings 24 and the elongate magnetic shielding elements 19 is chosen such that they lie on a common imaginary cylindrical surface about the z-axis surrounding the circumferential periphery of the magnet system. The openings 24 and elongate magnetic shielding elements 19 are evenly distributed around the z-axis as seen in the circumferential direction. The shape and operation of the elongate magnetic shielding elements 19 representing the parts of the frame structure 10 extending in the axial direction are known per se (see, European Pat. No. 0 141 149 A1).

Additionally, from the cross sectional view of FIG. 2, fastening claws 25 are shown attached to the ring-like coil receiving elements 12 and 13. The fastening claws 25 engage corresponding recesses in the magnetic coil turns, on the outer circumference thereof and provide, together with tightening bands 26, for an immovable mounting of the individual magnetic coils within the frame structure 10.

Figure 3:
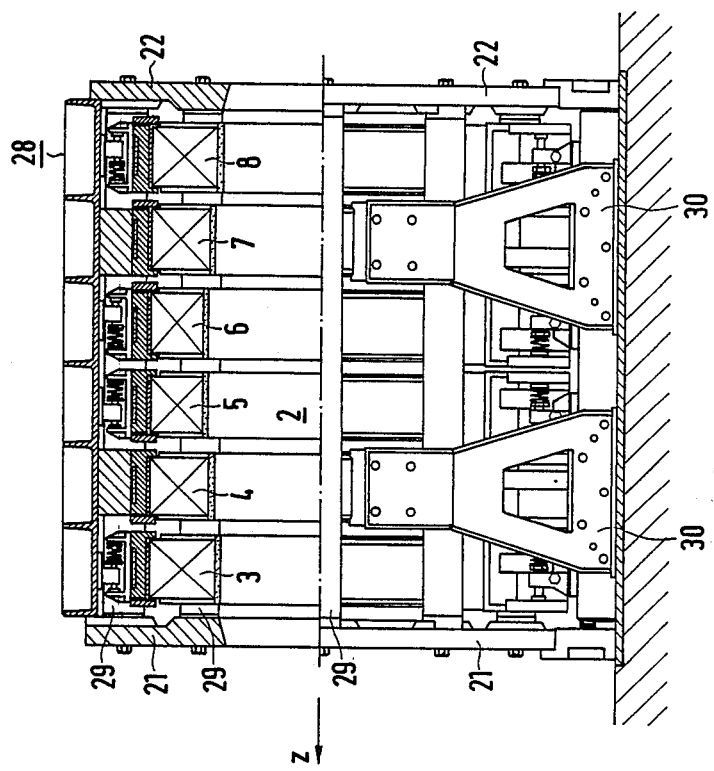
FIG. 3 is a further embodiment of a frame structure taken along the same lines as FIG. 1.

A further embodiment of a frame structure 28 about a magnet system 2 is shown in FIGS. 3 and 4. The presentation of FIGS. 3 and 4 corresponds largely to the presentation given for FIGS. 1 and 2. The frame structure 28 differs essentially from the frame structure 10 of FIGS. 1 and 2 only in that it has no special coil receiving elements made from a non-magnetic material through which the magnetic coils 4 and 7 are utilized for additional stiffening of the frame structure. The frame structure 28 consists substantially of the ferromagnetic end plates 21 and 22 together with the axially extending elongate magnetic shielding elements, in this case of rod-like shape 29, to form a rigid unit. In this embodiment the frame structure 28 is formed by the cage-like shielding itself. This has the advantage that the entire frame structure surrounding the magnetic coil system can be independently moved and adjusted.

Further, it is shown in FIGS. 3 and 4 that the non-adjustable magnetic coils 4 and 7 are bolted to the bottom parts 16 through gusset plates 30 which engage the coils laterally.

Figure 5:
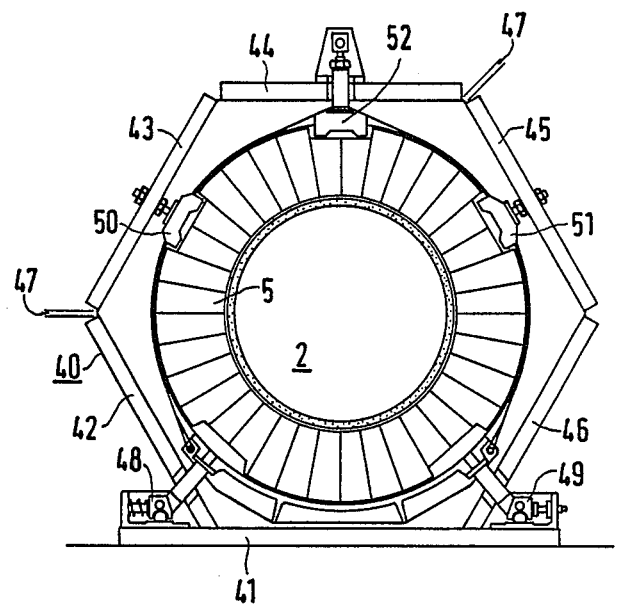
FIG. 5 is a cross sectional view of a still further embodiment of the frame structure of the present invention.

FIG. 5 shows a cross sectional view through magnetic coil 5 of a further frame structure 40 about the magnetic system indicated in FIG. 1. The frame structure 40 is comparable to the frame structure 28 in that it is composed only of ferromagnetic shielding parts. Accordingly, frame structure 40 contains several elongate magnetic plate-shaped shielding elements 41 to 46 which longitudinally extend in the direction of the z-axis and are spaced at their adjacent longitudinal sides by small spaces 47. Thus the several shielding elements 41 to 46 form, for the most part a closed tubular shielding enclosure which is mechanically held together by means of ferromagnetic front plates which are not visible in the figure but may correspond, for example, to the end plates 21 and 22 according to FIG. 1. The individual magnetic coils can then be connected to the frame structure 40 through support elements 48 and 49 as well as holding and adjusting elements 50 to 52.

According to the embodiment shown in FIG. 5 the magnetic shielding element frame structure 40 has approximately a hexagonically interior cross section for receiving the individual magnetic coils of the magnet system. It goes without saying that other polygons may be formed by a corresponding number of elongate magnetic plate-shaped shielding elements without detracting from the invention.

According to the invention, a ferromagnetic return is co-integrated into a cage-like frame structure about a system of several ring-shaped magnetic coils. The mutually spaced ferromagnetic shielding elements which may have cross section dimensions other than those shown in the figures, represent the axial parts of the frame structure and are connected to each other by means of two ferromagnetic end plates on the end faces thereof. The frame structures of this invention are relatively easy to assemble in situ. Further, they ensure secure mounting of the individual ring-shaped magnetic coils while simultaneously allowing for fine adjustment.

What is claimed is:

1. In a frame structure with devices for supporting and for adjusting ring-shaped magnetic coils of a magnet system which are lined up one behind the other along a common axis, which magnet system generates a homogenous magnetic base field for an installation used in nuclear spin tomography, said frame structure including a plurality of frame parts extending parallel to the axis, the improvement comprising:
   (a) said frame parts extending parallel to the axis being elongate magnetic shielding elements disposed on an imaginary cylindrical surface surrounding the magnet system and distributed regularly in the circumferential direction forming a cage-like structure;
   (b) said frame parts being mechanically connected with means for supporting and adjusting the ring-shaped magnetic coils of the magnet system within the frame structure;
   (c) at least one ring-like coil receiving element made of a non-ferromagnetic material rigidly connecting the individual magnetic coils to the elongate magnetic shielding elements extending parallel to the axis; and
   (d) a plate shaped magnetic shielding part with a central opening of predetermined radius at each of the end faces of said cage-like frame structure.

2. A frame structure according to claim 1 wherein said elongate magnetic shielding elements extending parallel to the axis in conjunction with said plate-shaped magnetic shielding parts at each of the end faces of said cage like structure alone form the frame structure.

3. A frame structure according to claim 1, wherein said ring-like coil receiving elements are formed from a plurality of segment-like individual pieces.

4. A frame structure according to claim 1, wherein said ring-like coil-receiving elements are provided with a plurality of feedthroughs, through which the elongate magnetic shielding elements are inserted.

5. A frame structure according to claim 1 wherein said elongate magnetic shielding elements are of a beam-shape.

6. A frame structure according to claim 1 wherein said elongate magnetic shielding elements are of a rod-shaped.

7. A frame structure according to claim 1 wherein said elongate magnetic shielding elements are of a plate-shape.

* * * * *